US011049930B2

(12) United States Patent
Qiao et al.

(10) Patent No.: US 11,049,930 B2
(45) Date of Patent: Jun. 29, 2021

(54) SEMICONDUCTOR STRUCTURE AND METHOD OF MANUFACTURING THE SAME

(71) Applicant: Shanghai Huali Microelectronics Corporation, Shanghai (CN)

(72) Inventors: Fulong Qiao, Shanghai (CN); Limin Zhou, Shanghai (CN); Xiao Yang, Shanghai (CN); Pengkai Xu, Shanghai (CN); Yu Huang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 16/681,830

(22) Filed: Nov. 13, 2019

(65) Prior Publication Data

US 2020/0212172 A1 Jul. 2, 2020

(30) Foreign Application Priority Data

Dec. 27, 2018 (CN) .......................... 201811610412.1

(51) Int. Cl.
*H01L 29/06* (2006.01)
*H01L 29/10* (2006.01)

(52) U.S. Cl.
CPC ...... *H01L 29/0603* (2013.01); *H01L 29/1079* (2013.01)

(58) Field of Classification Search
CPC .............. H01L 29/0603; H01L 29/1079; H01L 21/28123; H01L 29/401; H01L 29/78; H01L 21/28008

USPC ........................................................ 257/775
See application file for complete search history.

(56) References Cited

U.S. PATENT DOCUMENTS

| 10,141,403 | B1 * | 11/2018 | Cheng ............... H01L 29/66439 |
| 10,229,971 | B1 * | 3/2019 | Cheng ................... H01L 29/401 |
| 2002/0008261 | A1 * | 1/2002 | Nishiyama ...... H01L 21/823835 257/288 |
| 2002/0060323 | A1 * | 5/2002 | Jeong .................... G02F 1/1368 257/91 |
| 2002/0151170 | A1 * | 10/2002 | Maex .................... H01L 29/665 438/638 |
| 2006/0194446 | A1 * | 8/2006 | Beaman ............ H01L 21/28185 438/775 |

(Continued)

*Primary Examiner* — Sheikh Maruf
(74) *Attorney, Agent, or Firm* — Adsero IP

(57) ABSTRACT

The present invention provides a semiconductor structure and method of manufacturing the same. The semiconductor structure includes a substrate and a gate formed on the substrate. The above manufacturing method is used to form a gate on the substrate. The above manufacturing method specifically includes: providing a substrate; forming a trench in an upper portion of the substrate; depositing a gate layer on the substrate, the gate layer including two step portions extending from the outside of the trench to the inside of the trench; etching the gate layer from two ends of the trench along the two step portions toward the center of the trench to form the gate in the trench, wherein the width of the gate is smaller than the width of the trench. The manufacturing method of the present invention can easily and efficiently form a gate having a small critical dimension and precisely controllable on a semiconductor substrate, thereby meeting increasingly stringent gate size requirements.

7 Claims, 10 Drawing Sheets

(56) References Cited

U.S. PATENT DOCUMENTS

| | | | |
|---|---|---|---|
| 2007/0001235 A1* | 1/2007 | Rhodes | H01L 27/14683 257/384 |
| 2007/0105297 A1* | 5/2007 | Jeong | H01L 29/7843 438/197 |
| 2007/0108514 A1* | 5/2007 | Inoue | H01L 29/7834 257/330 |
| 2007/0254418 A1* | 11/2007 | Sheppard | H01L 29/66462 438/172 |
| 2011/0042729 A1* | 2/2011 | Chen | H01L 21/823814 257/288 |
| 2011/0133265 A1* | 6/2011 | Derderian | H01L 27/11521 257/315 |
| 2011/0201164 A1* | 8/2011 | Chung | H01L 21/82385 438/229 |
| 2013/0285123 A1* | 10/2013 | Adam | H01L 21/308 257/255 |
| 2013/0320396 A1* | 12/2013 | Salman | H01L 27/0262 257/119 |
| 2014/0094014 A1* | 4/2014 | Alptekin | H01L 21/76889 438/299 |
| 2014/0217505 A1* | 8/2014 | Lin | H01L 29/49 257/347 |
| 2015/0194481 A1* | 7/2015 | Lai | H01L 29/7843 257/649 |
| 2016/0190294 A1* | 6/2016 | Okamoto | H01L 29/42368 257/194 |
| 2017/0125401 A1* | 5/2017 | Gu | H01L 29/0692 |
| 2017/0125402 A1* | 5/2017 | Zhou | H01L 27/0727 |
| 2017/0140933 A1* | 5/2017 | Lee | H01L 29/785 |
| 2019/0097013 A1* | 3/2019 | Chen | H01L 29/401 |
| 2019/0164847 A1* | 5/2019 | Maekawa | H01L 29/78606 |
| 2019/0259842 A1* | 8/2019 | Basler | H01L 29/0878 |
| 2020/0381426 A1* | 12/2020 | Xu | H01L 29/0653 |

* cited by examiner

SEMICONDUCTOR STRUCTURE AND METHOD OF MANUFACTURING THE SAME

CROSS-REFERENCES TO RELATED APPLICATIONS

The present application claims priority to Chinese Patent Application No. 201811610412.1, filed on Dec. 27, 2018, entitled "A SEMICONDUCTOR STRUCTURE AND METHOD OF MANUFACTURING THE SAME", which is incorporated by reference herein for all purposes.

FIELD

The present invention relates to the field of semiconductor devices and their fabrication, and more particularly to gates of smaller line width dimensions and their fabrication.

BACKGROUND

Since the invention of integrated circuits by Dr. Jack Kilby of Texas Instruments in early years, scientists and engineers have made numerous inventions and improvements in semiconductor devices and processes. Over 50 years, the dimensions of semiconductors have been significantly reduced, which translates into an increasing processing speed and decreasing power consumption. To date, the development of semiconductors has largely followed Moore's Law, which roughly states that the number of transistors in dense integrated circuits doubles about every two years. At present, semiconductor processes are developing toward below 65 nm, and some companies are embarking on 40 nm processes. Just to provide a reference herein, a silicon atom is about 0.2 nm, which means that the distance between two separate components manufactured by a 40 nm process is about only two hundreds silicon atoms.

Semiconductor device manufacturing has therefore become increasingly challenging and advancing toward the physically possible limit. With the evolution of integrated circuit developments, the functional densities (for example, the number of interconnects per chip region) are also generally increasing as geometries (also known as critical dimension, line width, etc., that is, the smallest elements or lines that can be produced using a process) are reduced. This downsizing process can often offer benefits by increasing productivity and lowering related costs. However, it is challenging how to accurately fabricate devices with increasingly reduced line widths.

Currently in the prior art, the gate of the semiconductor device is usually formed by first forming a gate layer, and etching the gate layer from top to bottom through a photoresist (PR) or a photo resist/bottom anti-reflection coating (BARC) structure with a photo-resist as a mask, thereby achieving the transfer of graphics.

As mentioned above, as the critical dimension continues to shrink with the development of the technology node, in order to improve the resolution, the wavelength of the optical exposure machine is continuously reduced, the machine is more and more expensive, and the production cost is higher and higher.

For example, the traditional 40-65 nm gate structure manufacturing process often requires the use of expensive KrF excimer laser (248 nm) or ArF excimer laser (193 nm), which is costly. And, for improving an exposure process window, the thickness of the photo-resist should be thin, it is also necessary to introduce a complicated process such as a hard mask and a three-layer mask.

In the prior art, in order to form a gate whose critical dimension is continuously reduced, high manufacturing cost is required, which causes difficulty in manufacturing.

In view of the above, there is a need for a semiconductor gate and a method of manufacturing the same that can form a gate having a continuously reduced critical dimension as described above at a reduced cost, and allows the critical dimension of the gate to be accurately adjusted.

SUMMARY

A brief summary on one or more aspects is given below to provide the basic understanding for these aspects. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

In order to solve the above problems of requiring a large number of process steps and a very high manufacturing cost in the prior art while manufacturing a gate structure whose critical dimension is continuously reduced, the present invention provides a method for reducing the cost of manufacturing a gate structure of critical dimension continuously reduced. The method specifically comprising: providing a substrate;

forming a trench in an upper portion of the substrate;

depositing a gate layer on the substrate, the gate layer including two step portions extending from the outside of the trench to the inside of the trench; and forming the gate in the trench by etching the gate layer from two ends of the trench along the two step portions toward the center of the trench, wherein a width of the gate is smaller than a width of the trench.

In the above embodiments, optionally, the gate layer is isotropically etched by a dry etching process.

In the above embodiments, preferably, the etching gas used in the dry etching process comprises: SF6.

In the above embodiments, optionally, a width of the gate formed by the etching is adjusted by adjusting the etching time.

In the above embodiments, preferably, the width of the gate is 40-65 nm.

In the above embodiments, optionally, etching the gate layer further comprises:

forming a hard mask layer on the gate layer, the hard mask layer is located between the two step portions, performing the etching using the hard mask layer; and removing the hard mask layer after forming the gate.

In the above embodiments, preferably, the hard mask layer is an oxide.

The invention also provides a semiconductor structure comprising a substrate and a gate on the substrate, wherein an upper portion of the substrate has a trench, and the gate is located in the trench, wherein a width of the gate is smaller than a width of the trench.

In the above embodiments, optionally, the width of the gate is associated with the time as taken to etch the gate.

In the above embodiments, optionally, the width of the gate is 40-65 nm.

The gate structure manufactured according to the manufacturing method of the present invention has a small critical dimension and the above critical dimension can be accurately controlled. Moreover, according to the manufacturing method of the present invention, many complicated process flows are not required, and the manufacturing cost is controllable.

Figure 1:
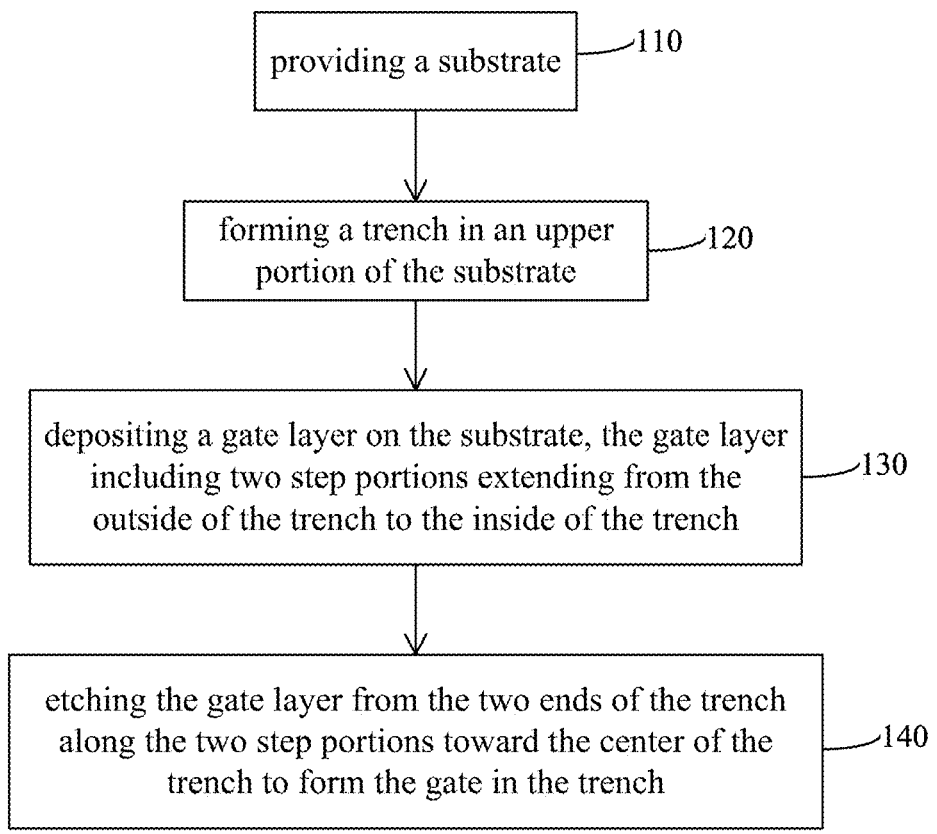
FIG. 1 shows a flowchart of a method of manufacturing a semiconductor structure according to the present invention.

REFERENCE SIGNS 210 substrate
220 trench
230 gate layer
231 step portion
233 gate
240 hard mask layer
250 photo-resist
251 gap

DETAILED DESCRIPTION

The following description is presented to enable one of ordinary skill in the art to implement and use the present invention and incorporate it into the context of a particular application. Various modifications, as well as various usages in various applications, will be readily apparent to those skilled in the art, and the generic principles defined herein may be applicable to a wide range of embodiments. Thus, the present invention is not limited to the embodiments presented herein, but rather should be given its broadest scope consistent with the principles and novel features disclosed herein.

In the following detailed description, numerous specific details are set forth to provide a more thorough understanding of the present invention. However, it will be apparent to those skilled in the art that the present invention may be practiced without limitations from these specific details. In other words, well-known structures and devices are shown in a block diagram form and are not shown in detail, so as to avoid obscuring the present invention.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Note that when used, the flags left, right, front, back, top, bottom, front, back, clockwise, and counter-clockwise are used for convenience purposes only and do not imply any specific fixed direction. In fact, they are used to reflect the relative position and/or direction between various parts of an object.

As used herein, the terms "over . . . "under . . . ", "between . . . and . . . ", and "on . . . "means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

As described above, as the critical dimension in semiconductor manufacturing is shrinking, how to accurately control the line width of a semiconductor device at a low cost is an urgent problem to be solved in the art.

Currently in the prior art, the gate of the semiconductor device is usually formed by first forming a gate layer, and etching the gate layer from top to bottom through a photoresist (PR) or a photo resist/bottom anti-reflection coating (BARC) structure with a photo-resist as a mask, thereby achieving the transfer of graphics. In this process, in order to improve the resolution, the wavelength of the optical exposure machine is continuously reduced, the machine is more and more expensive, and the production cost is higher and higher. For example, the traditional 40-65 nm gate structure manufacturing process often requires the use of expensive KrF excimer laser (248 nm) or ArF excimer laser (193 nm), which is costly. And, for improving an exposure process window, the thickness of the photo-resist should be thin, it is also necessary to introduce a complicated process such as a hard mask and a three-layer mask.

To this end, in order to be able to control the manufacturing cost of a gate structure having a small critical dimension, the present invention provides a method of fabricating a semiconductor structure. Please refer to FIG. 1; FIG. 1 is a flow chart showing a method of fabricating a semiconductor structure provided by the present invention. As shown in FIG. 1, the method provided by the present invention includes step 110, providing a substrate;

step 120, forming a trench in an upper portion of the substrate;

step 130, depositing a gate layer on the substrate, the gate layer including two step portions extending from the outside of the trench to the inside of the trench; and step 140, etching the gate layer from the two ends of the trench along the two step portions toward the center of the trench to form the gate in the trench.

Please further refer to FIG. 2-10 to specifically understand the above steps 110-140. FIGS. 2-10 are schematic views showing the structure of a semiconductor in the manufacturing process of the manufacturing method provided by the present invention. The drawings are provided for illustration only and should not unduly limit the scope of the claims. Those skilled in the art will appreciate that there may be many alternatives, and variations. One or more steps may be added, removed, repeated, rearranged, modified, replaced, and/or overlap depending on the implementation and this does not affect the scope of the claims.

Figure 2:
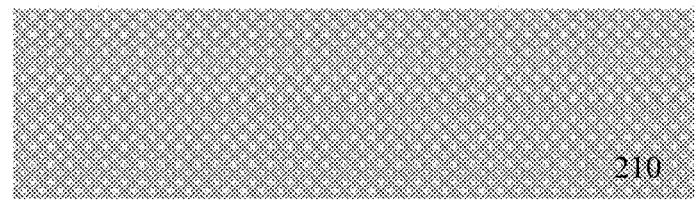
FIGS. 2-10 show a schematic diagram of the semiconductor structure in the manufacturing process of the manufacturing method of the present invention.

As shown in FIG. 2, FIG. 2 illustrates the substrate 210 provided in step 110, which may be a semiconductor wafer such as a silicon wafer. Alternatively or additionally, the substrate 210 may comprise an elemental semiconductor material, a compound semiconductor material, and/or an alloy semiconductor material. Examples of elemental semiconductor materials can be, but are not limited to, crystalline silicon, polycrystalline silicon, amorphous silicon, germanium, and/or diamond. Examples of compound semiconductor materials may be, but are not limited to, silicon carbide, gallium arsenide, gallium phosphide, indium phosphide, indium arsenide, and/or indium antimonide. Examples of alloy semiconductor materials may be, but are not limited to, SiGe, GaAsP, AlInAs, AlGaAs, GaInAs, GaInP, and/or GaInAs.

Figure 3:
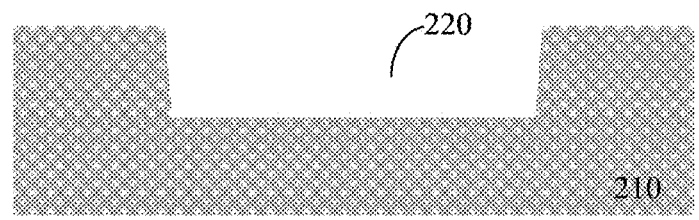

As shown in FIG. 3, FIG. 3 shows a schematic structural view of a trench 220 in the substrate 210 after performing step 120. Those skilled in the art will appreciate that the trench 220 described above may be formed in the substrate 210 by existing or future manufacturing processes. Further, the above process of forming the trench 220 may be an etching process, and the etching process may include dry etching, wet etching, and/or other etching methods (for example, reactive ion etching). Etching process may be a purely chemical (plasma etching), purely physical (ion milling), and/or combinations of the foregoing.

In the above process, it is usually required to use a mask layer (usually a patterned photo-resist) to define a region of the substrate to be etched; only a selected portion, in this step of the embodiment, the portion of the substrate 210 corresponding to the trench 220 is etched off during the etching process. The above-described patterning process may include a photo-resist coating (e.g., spin coating), soft baking, mask aligning, exposure, post-exposure baking, developing the photo-resist, rinsing, drying (e.g., a hard bake), other suitable processes, and/or combinations of the foregoing. The above etching can be achieved by low-cost I-line (365 nm) lithography conditions without the above-mentioned costly lithography process.

Figure 4:
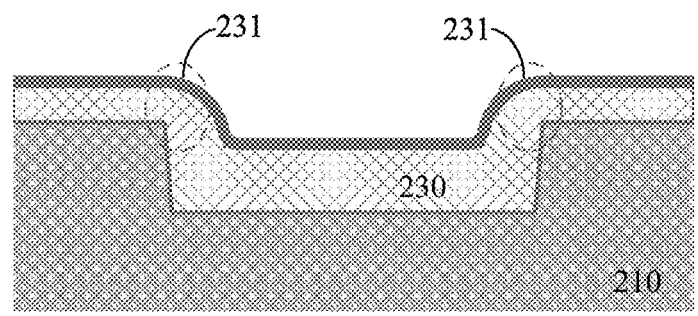
Figure 5:
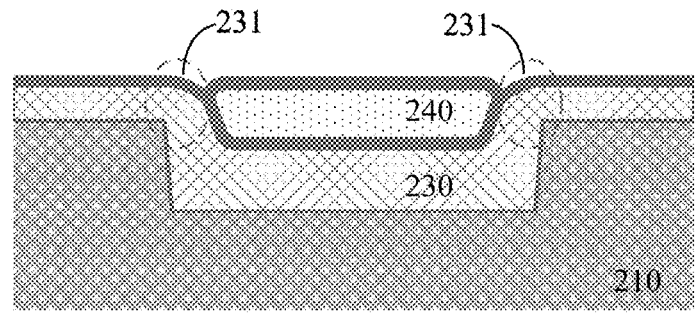

As shown in FIG. 4, FIG. 4 shows a schematic diagram of the structure of performing the deposition of the gate layer 230 on the substrate 210 in step 130. It can be seen from FIG. 4 that the above-described gate layer 230 comprises two step portions 231 extending from the outside of the trench to the inside of the trench, as shown in the dashed oval in the figure. The above deposition processes include, but are not limited to, forming the gate layer 230 described above by chemical vapor deposition (CVD), physical vapor deposition (PVD), atomic layer deposition (ALD), high density plasma CVD (HDPCVD), metal organic CVD (MOCVD), or plasma Enhanced CVD (PECVD).

Those skilled in the art will be appreciated the gate layer can be deposited to fill the entire trench portion by depositing a gate layer on the surface of the substrate on which the trench is formed. Meanwhile, between the two step portions 231, there may be a recess as shown in FIG.4.

Further, in the above step 130, those skilled in the art should know that the material of the deposited gate layer 230 can be adjusted according to actual needs, and the material of the gate layer 230 includes but is not limited to polysilicon (Poly).

Further, before depositing the gate layer 230, the method further includes depositing a gate insulating layer on the surface of the substrate, such as a light gray layer between the gate 230 and the substrate 210 as shown in the figure.

In one embodiment, after the gate layer 230 is formed by deposition, it may further include a step of depositing an insulating layer over the gate layer 230 to protect the gate layer 230. A dark gray layer above the gate layer 230 in FIG. 4 shows a schematic view of the above insulating layer, for example.

In another embodiment, preferably, after the gate layer 230 is formed by deposition, it may further include the step of forming a hard mask layer 240 above the gate layer 230 in the recess corresponding to the trench. As described above, by depositing the gate layer 230, a recess corresponding to the trench can be formed between the two step portions 231, and thus, the above-described hard mask layer 240 can be formed in this recess. Those skilled in the art will appreciate that the recess described above for forming the hard mask layer can be obtained by existing or future techniques. For example, the recess can also be formed by etching the gate layer 230.

The hard mask layer 240 described above may be formed by deposition. The above deposition processes include, but are not limited to form the hard mask layer 240 described above by chemical vapor deposition (CVD), physical vapor deposition (PVD), atomic layer deposition (ALD), high density plasma CVD (HDPCVD), metal organic CVD (MOCVD), or plasma Enhanced CVD (PECVD). It should be understood by those skilled in the art that if the deposited hard mask layer 240 further includes portions covering other area of the gate layer, the excess portions may be removed by another etching process, only the portion of the hard mask layer between the two step portions 231 is remained.

The etching process described above may include dry etching, wet etching, and/or other etching methods (e.g., reactive ion etching). Etching process may be a purely chemical (plasma etching), purely physical (ion blunt cut (ion milling)), and/or combinations of the foregoing. In the above process, it is usually required to use a mask layer (usually a patterned photo-resist) to define a region of the substrate to be etched; only a selected portion, in this step of the embodiment, the portion of the surface of the other gate layer not covered by the hard mask layer is removed during the etching process. The above-described patterning process may include a photo-resist coating (e.g., spin coating), soft baking, mask aligning, exposure, post-exposure baking, developing the photo-resist, rinsing, drying (e.g., a hard bake), other suitable processes, and/or combinations of the foregoing.

Those skilled in the art should know that the material of the hard mask layer 240 can be adjusted according to actual needs. For example, in the case where the gate layer 230 is made of a polysilicon material, the hard mask layer 240 may be made of silicon oxide having certain selectivity to polysilicon.

Figure 6:
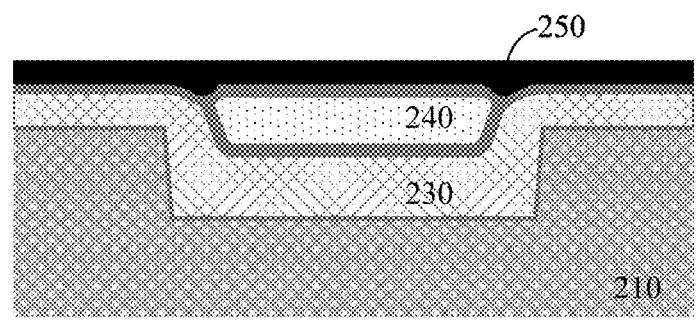
Figure 7:
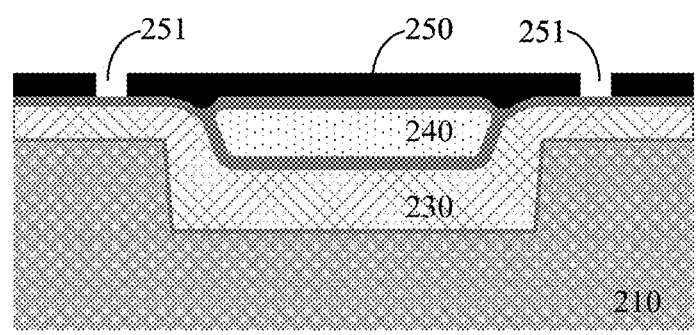

After the hard mask layer 240 is formed, photolithography is further performed on the semiconductor structure to prepare for subsequent etching of the gate layer 230. Please refer to FIG. 6. FIG. 6 is a schematic diagram showing the deposition of the photo-resist 250 on the surface of the gate layer 230 and the hard mask layer 240.

Further, the photo-resist 250 is patterned to enable subsequent etching gas to contact the gate layer 230 from the gap 251 and to etch the gate layer 230. The above-described patterning process may include a photo-resist coating (e.g., spin coating), soft baking, mask aligning, exposure, post-exposure baking, developing the photo-resist, rinsing, drying (e.g., a hard bake), other suitable processes, and/or combinations of the foregoing. The above etching can be achieved by low-cost I-line (365 nm) lithography conditions without the above-mentioned costly lithography process.

As can be seen from the patterning of the photo-resist 250 described above, the patterned pattern in the present invention is not the same as the gate pattern actually required to be formed, because in the prior art, the formation of the gate needs to be transferred from the top to bottom of the pattern of the photo-resist. Therefore, the patterning of the photo-resist must be consistent with the gate pattern, and the precision is required to be very high which requires large cost. The method of the present invention etches the gate layer from both sides through the steps in the trench, the pattern of the photo-resist does not need to correspond one-to-one with the gate pattern, and the precision requirement does not need to be high.

Figure 8:
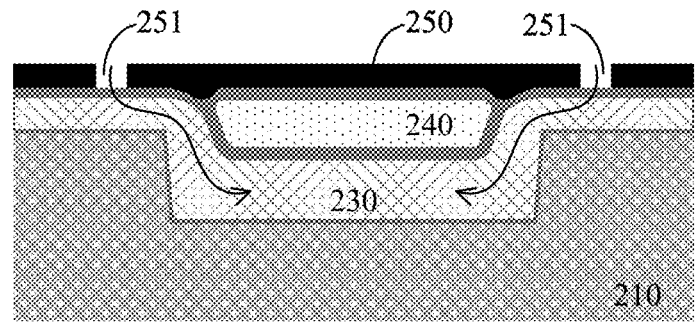

With further reference to FIG. 8, the present invention further comprises a step 140 to form a gate in the trench by etching the gate layer 230 from the two ends of the trench along the two step portions 231 toward the center of the trench. FIG. 8 shows an etching path of etching gas during etching of the gate layer 230.

In the above process of etching the gate layer, the method uses the dry etching process to isotropically etch the gate layer 230. The isotropic means that the etching conditions in all directions are substantially the same. Therefore, the etching can not only etch from top to bottom, but also achieve lateral etching by the etching gas. In particular, the central portion of the gate layer 230 is protected by the hard mask layer 240. Therefore, the etching can be performed by etching the gate layer from the two ends of the trench along the two step portions 231 toward the center of the trench.

More preferably, the above dry etching process further comprises a step of adjusting the power of etching to adjust the etching rate, including adjusting the rate of the longitudinal and lateral etching, so that the above isotropic etching is a strong isotropic etching.

In the above embodiment, more preferably, SF6 gas can be used to tune the above etching to be strong isotropic etching. SF6 gas has a strong lateral etching capability and is suitable for an environment requiring more lateral etching as in the present method.

Figure 9:
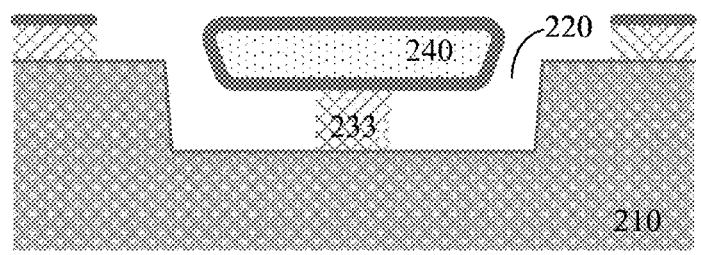
Figure 10:
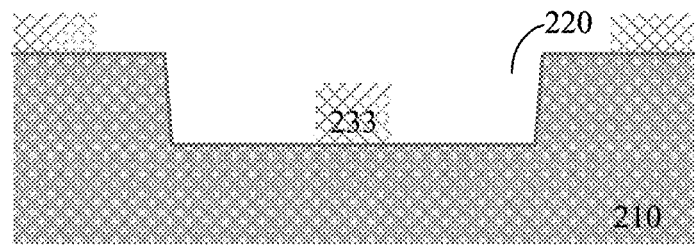

Please refer to FIG. 9, which shows a gate 233 formed after the etching step 140. The gate 233 is formed in the trench 220, and the width of the gate 233 is smaller than the width of the trench 220. Still further, please refer to FIG. 10, wherein after forming the gate 233, the method further comprises a step of removing the hard mask layer. FIG. 10 shows a schematic structure after removing the hard mask layer.

In the above steps, the hard mask layer may be removed by wet etching. Those skilled in the art will appreciate that the wet etching described above is merely an example of a method of removing the hard mask layer described above, and is not limiting.

Further, by adjusting the time of the etching step 140 described above, the width of the gate 233 formed as described above can be adjusted. Different from the prior art in which the line width of the gate is associated with the patterning of the pre-lithography step, the line width of the gate in the present invention is adjusted by adjusting the time spent by the etching step.

Figure 11:
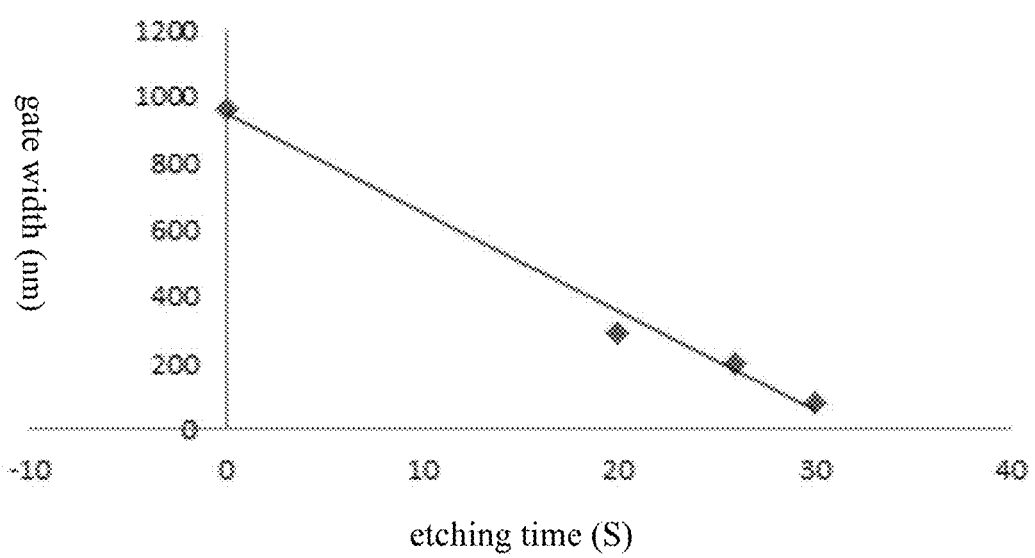
FIG. 11 shows the relationship between the width of the gate formed in the present invention and the etching time.

Please further refer to FIG. 11. FIG. 11 shows the relationship between the gate width and the etching time, wherein the unit of the gate width is nm and the unit of etching time is second. The diamond dots in the figure are obtained embodiments by different etching methods by the present method, and the relationship of the gate width-etching time is constructed according to the diamond dots in the figure.

According to different embodiments, it can be modeled that the above relationship between the gate width y and the etching time x is satisfied:

$y = -29.625x + 942.86$ $R^2 = 0.9897$

Therefore, according to the method of the present invention, the width of the gate can be adjusted by adjusting the etching time according to the above formula. Further, according to the above formula, it can be known that there is a high linear correlation ($R^2=0.9897$) between the width of the gate and the etching time. And unlike the prior art in which the accuracy of the line width depends on the high lithographic apparatus, the line width of the above gate can be precisely controlled by controlling the etching time in the present method.

Further, since the method of the present invention is to obtain a gate having a small line width, the width of the obtained gate can be between 40 and 65 nm by controlling the etching time.

Therefore, based on the method of the present invention, a semiconductor structure can be manufactured. As shown in FIG. 10, the semiconductor structure includes a substrate 210 and a gate 233 on the substrate 210. The upper portion of the substrate has a trench 220. The gate 233 is located in the trench 220, and the width of the gate 233 is smaller than the width of the trench 220.

Further, the width of the gate 233 is related to the length of time period of the gate 233 etching process. Further, the width of the gate is 40-65 nm.

Accordingly, the manufacturing method of the present invention and the embodiment of the semiconductor structure according to the manufacturing method have been described.

The manufacturing method of the present invention has operability in an actual manufacturing process. FIGS. 12-16 are schematic diagrams showing physical slicing structure of a semiconductor structure manufactured in accordance with the manufacturing method provided by the present invention.

Figure 12:
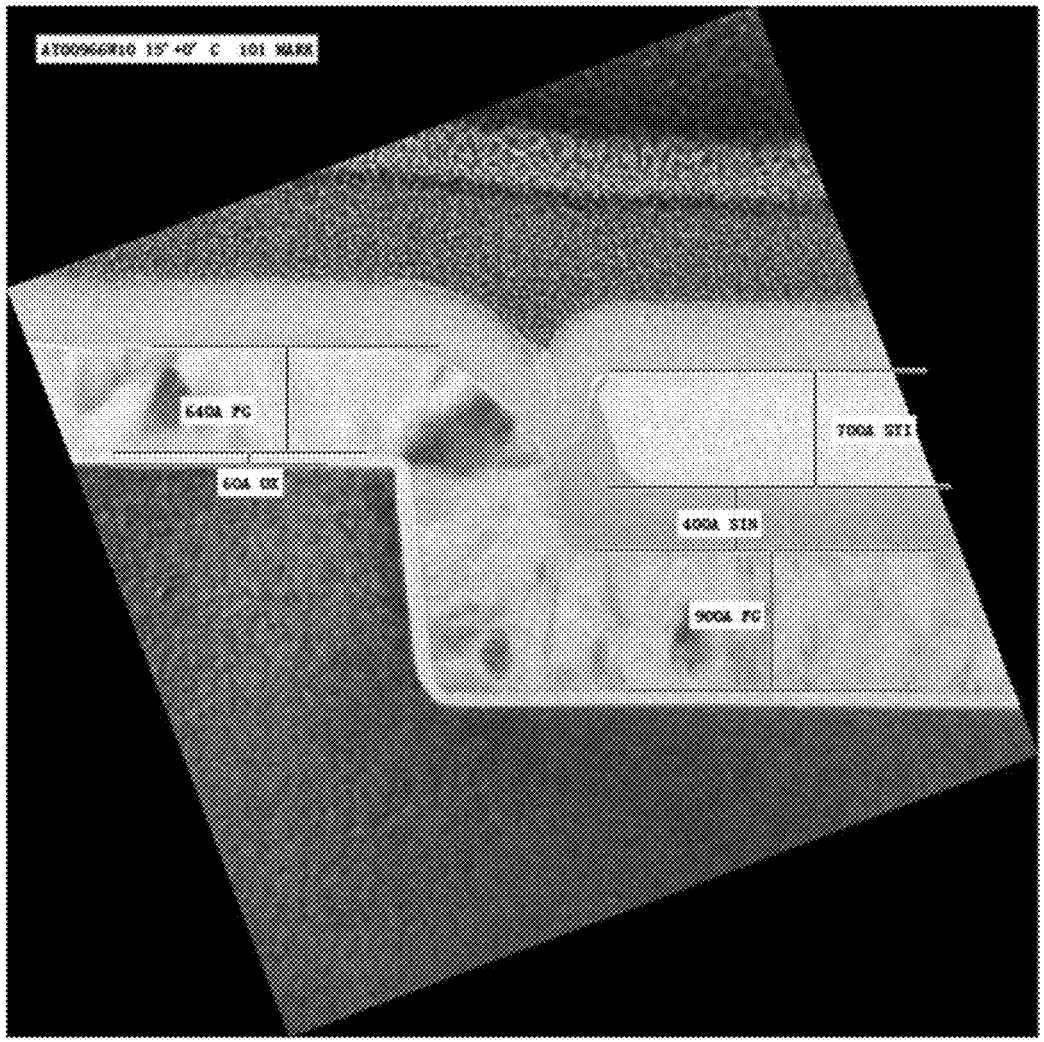
FIGS. 12-16 show a schematic diagram of physical slicing structure of a semiconductor structure fabricated by the manufacturing method of the present invention.

FIG. 12 is an enlarged schematic view showing a specific structure at both ends of the trench after the gate layer and the hard mask layer are deposited, and before etching.

Figure 13:
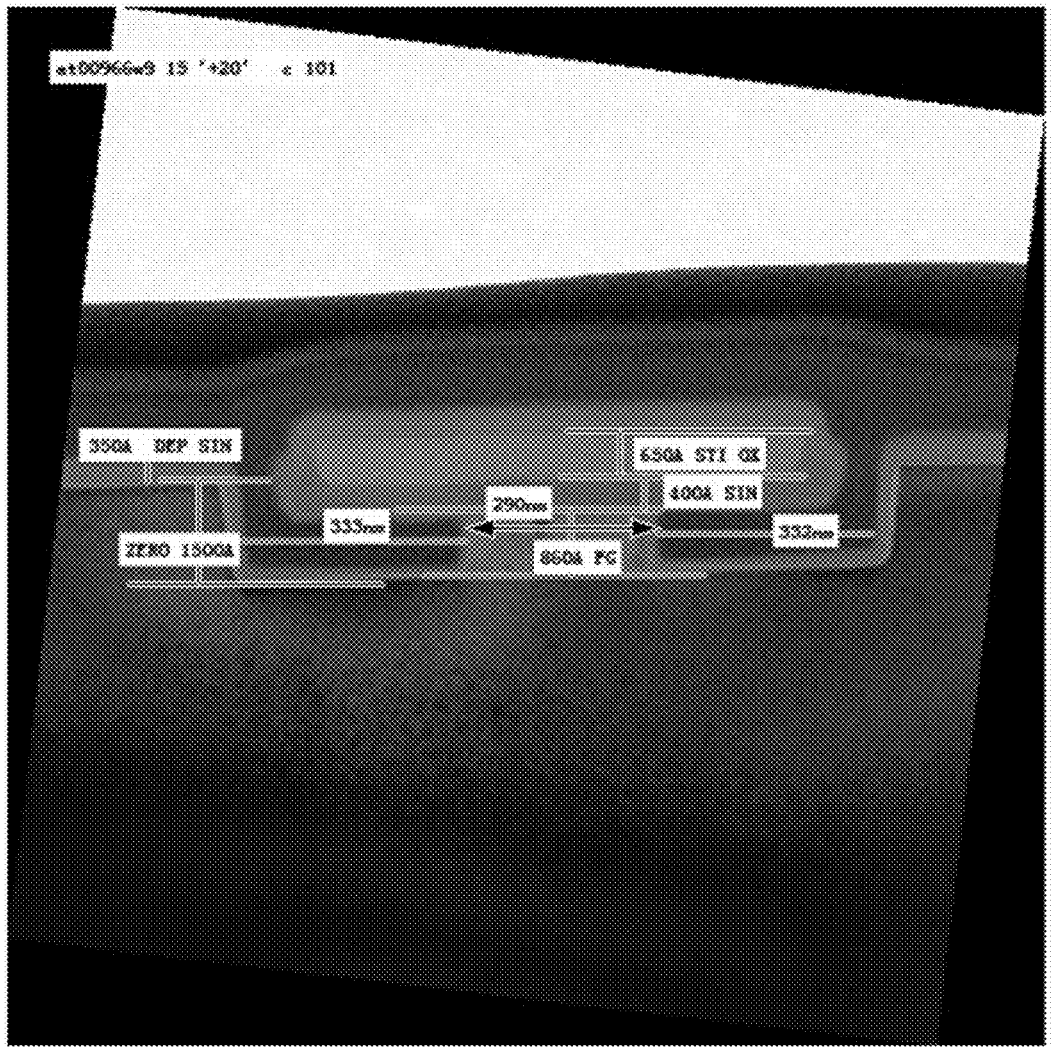

FIG. 13 is a view showing a structure of a gate obtained after etching for a period of time. In the structure shown in FIG. 13, the width of the gate is 290 nm.

Figure 14:
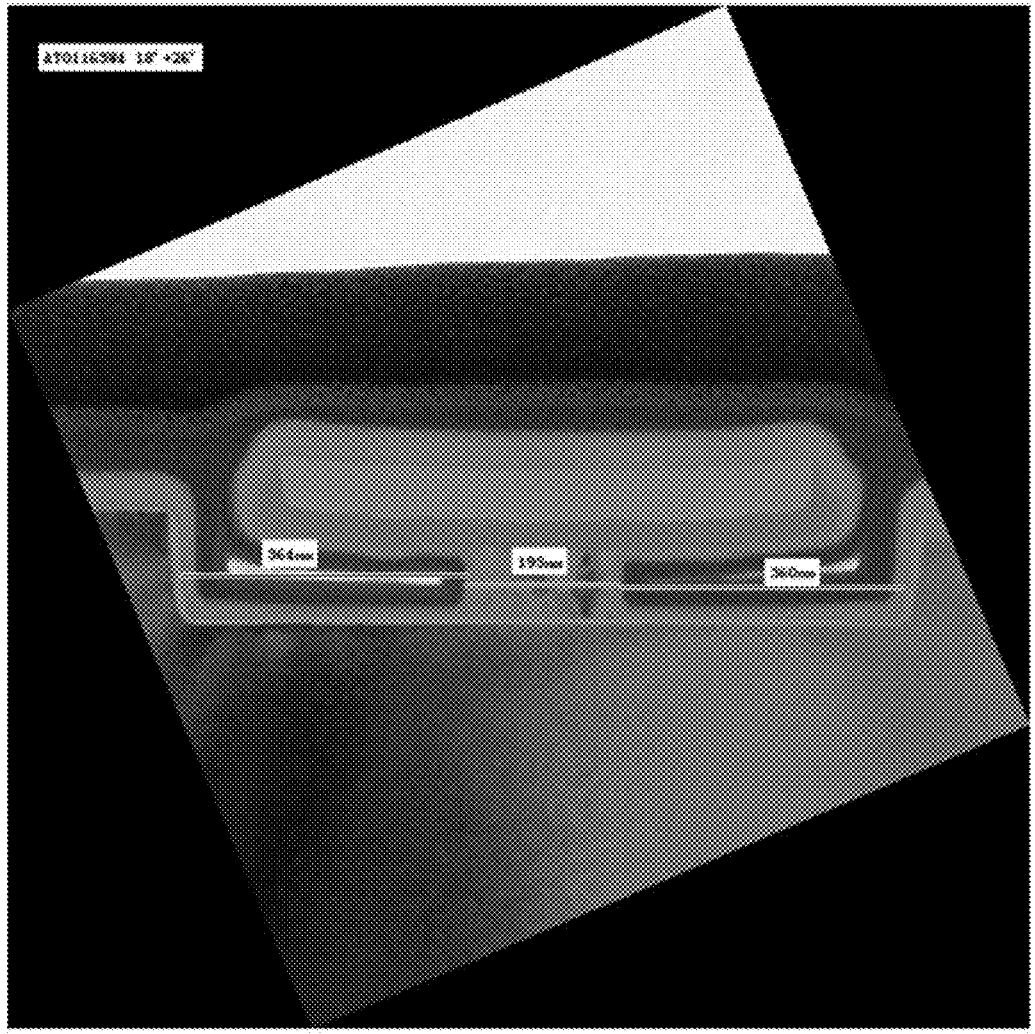

FIG. 14 is a view showing a structure of a gate obtained after etching for a period of time. In the structure shown in FIG. 14, the width of the gate is 195 nm.

Figure 15:
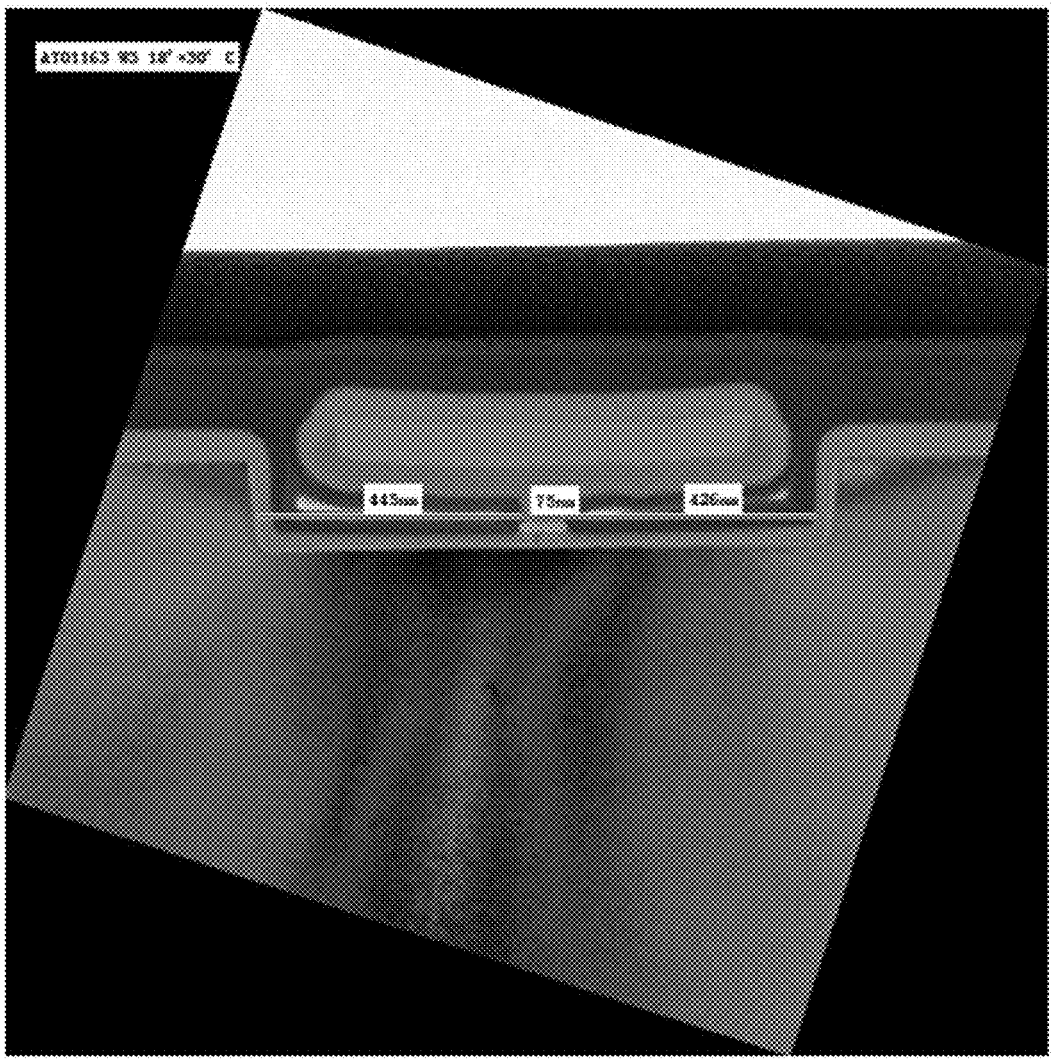

FIG. 15 is a view showing a structure of a gate obtained after etching for a period of time. In the structure shown in FIG. 15, the width of the gate is 75 nm.

Figure 16:
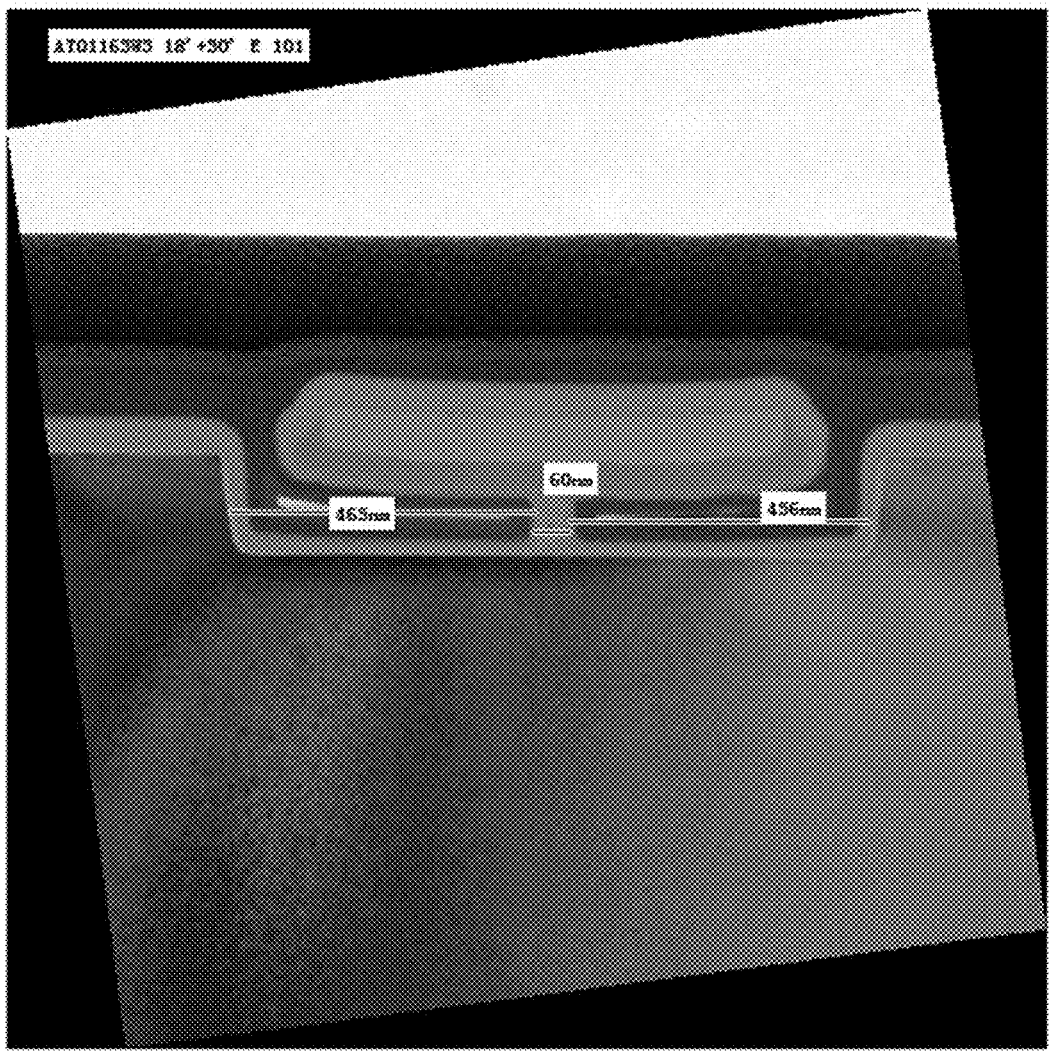

FIG. 16 is a view showing a structure of a gate obtained after etching for a period of time. In the structure shown in FIG. 16, the width of the gate is 60 nm.

Therefore, by the method provided by the present invention, the gate with the line width conforming to the node requirement can be effectively obtained, and as described above, the method provided by the present invention does not require an expensive equipment machine, and the manufacturing cost is effectively saved.

Although the present disclosure has been described with respect to certain exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A method of manufacturing a semiconductor structure for forming a gate on a substrate, wherein the method of manufacturing comprises:
   providing a substrate;
   forming a trench in an upper portion of the substrate, the trench being characterized by a first width;
   depositing a gate layer on the substrate, the gate layer including two step portions extending from the outside of the trench to the inside of the trench, the two step portions being positioned apart by a second width, the second width being less than the first width;
   forming a first isolation layer overlaying the gate layer;
   forming a hard mask layer between the step portions;
   forming a second isolation layer overlying the hard mask layer;
   forming a photoresist overlaying the first isolation layer and the second isolation layer; and
   forming the gate in the trench by etching the gate layer from two ends of the trench along the two step portions toward the center of the trench, wherein a width of the gate is smaller than a width of the trench.

2. The manufacturing method of claim 1, wherein the gate layer is isotopically etched by a dry etching process.

3. The manufacturing method of claim 2, wherein the etching gas used in the dry etching process comprises: SF6.

4. The manufacturing method of claim 1, wherein a width of the gate formed by the etching is adjusted by adjusting the etching time.

5. The manufacturing method of claim 4, wherein the width of the gate is 40-65 nm.

6. The manufacturing method of claim 1, wherein etching the gate layer further comprises:
   forming a hard mask layer on the gate layer, the hard mask layer is located between the two step portions, performing the etching using the hard mask layer; and
   removing the hard mask layer after forming the gate.

7. The manufacturing method of claim 6 wherein the hard mask layer is an oxide.

* * * * *